(12) United States Patent
Goela et al.

(10) Patent No.: US 6,616,870 B1
(45) Date of Patent: Sep. 9, 2003

(54) METHOD OF PRODUCING HIGH ASPECT RATIO DOMES BY VAPOR DEPOSITION

(75) Inventors: Jitendra S. Goela, Andover, MA (US); Zlatko Salihbegovic, New Iberia, LA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/633,210

(22) Filed: Aug. 7, 2000

(51) Int. Cl.⁷ ............................................. C23C 16/22
(52) U.S. Cl. ........................ 264/39; 264/1.21; 264/81; 264/334; 249/115
(58) Field of Search .................. 264/40.1, 81, 1.21, 264/39, 338, 334; 249/115

(56) References Cited

U.S. PATENT DOCUMENTS

| | | |
|---|---|---|
| 4,978,577 A | 12/1990 | Purohit et al. |
| 4,997,678 A | 3/1991 | Taylor et al. |
| 5,453,233 A | 9/1995 | Teverovsky et al. |
| 5,686,195 A | 11/1997 | Taylor et al. |
| 6,042,758 A | 3/2000 | Goela |

OTHER PUBLICATIONS

Goela et al., "Precision Replication of Conformal Zns Optics", 7$^{th}$ DOD Electromagnetic Window Symposium at APL, Laurel, MD, pp. 1–8, May 5–7, 1998.

Goela et al., "Fabrication of Conformal ZnS Domes by Chemical Vapor Deposition", SPIE Meeting, Orlando, Florida, Apr. 5–9, 1999, and May 11–13, 1999.

Goela et al., "Replication of Conformal Surfaces by Chemical Vapor Deposition", Proceedings 8$^{th}$ DOD Electromagnetic Windows Symposium, U.S. Airforce Academy, pp. 313–326, Apr. 24–27, 2000.

Primary Examiner—Stefan Staicovici
(74) Attorney, Agent, or Firm—John J. Piskorski

(57) ABSTRACT

An apparatus for the manufacture of chemical vapor deposited domes. The apparatus has a vapor deposition chamber with a plurality of sides, a base and a top where the base has a reactant port for receiving a flow of chemical reactants. A male mandrel is joined to one of a plurality of sides of the deposition chamber such that the flow of chemical reactants in the vapor deposition chamber does not impinge on the mandrel.

12 Claims, 5 Drawing Sheets

METHOD OF PRODUCING HIGH ASPECT RATIO DOMES BY VAPOR DEPOSITION

BACKGROUND OF THE INVENTION

The present invention is directed to an apparatus and method for preparing high aspect ratio articles by vapor deposition. More specifically, the present invention is directed to an apparatus and method for preparing high aspect ratio articles by vapor deposition on male mandrels.

Chemical vapor deposition (CVD) has been used to provide various materials either in free-standing bulk form or as a layered coating on a substrate. CVD methods of providing zinc sulfide layers and articles are described in commonly assigned U.S. Pat. Nos. 4,978,577 and 5,686,195, and in references cited therein. Generally, the previous methods of producing bulk material by CVD processing have provided solid shapes, the surfaces of which are then machined to their final article form. Replication techniques for producing "near-net shape parts" which minimize machining are suggested and some results described in Goela et al.,"CVD Replication for Optics Applications", SPIE Proc., 1047, pages 198–210 (1989). A replication process for producing silicon carbide articles described in U.S. Pat. No. 4,997,678 provides an in situ applied coating of carbon on a polished pre-shaped substrate prior to initiating the chemical vapor deposition of silicon carbide to form an article replicating a surface of the substrate.

While the techniques described in the above references have produced near-net shape articles, there continues to be a need for a precision replication technique which will provide precisely shaped articles, such as optical components, without the need for final machining of the optical surfaces. The techniques described in U.S. Pat. No. 4,997,678 provide relatively good replicas, however, the carbon rich film used therein is applied in situ at the beginning of each production deposit. Such does not provide an opportunity to measure or otherwise verify the dimensions of the film prior to commencing the production run, and allows uneven growth of the carbon rich film to result in uncontrolled deviations in the replicated article. Moreover, the carbon rich film tends to adhere to the surface of the replica when such is separated from the substrate. These characteristics tend to limit the ability of this technique to replicate the finish of the substrate.

Techniques that provide precision replication of, and facile release from, a substrate are particularly needed. For instance, infrared sensors used for navigation, guidance and targeting on aircraft and missiles require protection from the elements by transmissive windows or domes. Preferably such windows or domes are provided in a shape which minimizes aerodynamic drag while avoiding transmission irregularities. In a missile, the preferred location is in the nose. A spherical dome at this location produces considerable drag which can be significantly reduced by factors of two or more by the use of an extended generally conical shaped dome. The fabrication of such a dome, however, is made difficult, or even impossible, when machining of the interior surfaces of the dome is required since the functionality of the required apparatus decreases as the diameter of the cone decreases and its length is extended. The precision replication of such interior surface of a dome on a reusable mandrel, such that machining or polishing of such surface is not required, would provide significant fabrication advantages. Certain CVD produced bulk materials, such as zinc sulfide and zinc selenide, however, due to their thermal expansion characteristics and those of their preferred mandrel materials, have not previously been produced on the exterior surfaces of a curved male mandrel. Instead when such materials have been used to produce curved products, they have been fabricated by deposits formed on the interior surfaces of curved female mandrels, whereby the interior surfaces of such curved articles require considerable machining to provide their required final figure and finish.

Production of zinc sulfide and zinc selenide shaped parts such as domes is described in U.S. Pat. No. 5,453,233 to Teverosky et al. In this method, the material is deposited on a female mandrel as shown in FIG. 2. FIG. 2 shows a schematic of an isolation fixture 30 with multiple female mandrels 32. Reactants 34 pass from a gas injector 36 toward exhaust 38. Each mandrel 32 is fabricated with a figure that is negative of the actual part being produced. In this configuration, the outer surface of the dome is produced in a near-net shape by the CVD process. For this configuration to succeed, the thermal expansion coefficient of the mandrel preferably is less than that of the material being deposited. The female configuration is preferred over the male configuration because the mandrel does not stick out in the flow of reactants 34 and convection currents 40 effecting the flow pattern in the deposition area. The method is very effective in producing domes of aspect ratios (AR)<0.5. The aspect ratio, which is also known as fineness ratio, is defined as the ratio of the dome length to its diameter. See also "Replication of Conformal Surfaces by Chemical Vapor Deposition" by Goela et al., page 315, lines 2–3, presented at the U.S. Air Force Academy on Apr. 24–27, 2000.

If an AR of equal to or greater than 0.5 is desired, the above method can be used to produce zinc sulfide domes by the CVD process but the above method does not yield domes of satisfactory quality. This is due to the following reasons: (1) the thickness of the material deposited at the dome base is larger than at the apex reducing the effective diameter of the opening in the female mandrel; (2) the thicker deposit at the base makes it difficult to remove the deposit from the isolation fixture; (3) the quality of the material deposited at the dome apex gets degraded when the deposition thickness is large. Accordingly, better methods are desired to deposit high quality shaped parts of high aspect ratios.

U.S. Pat. No. 6,042,758 to Goela and assigned to CVD, Inc. discloses a process for preparing dimentionally precise articles by chemical deposition. The '758 patent discloses that a female mandrel is preferred for preparing articles with high aspect ratios (column 4, lines 1–2). The ratio as defined in the '758 patent is the ratio of the article's diameter to its height (or length) (column 4, lines 3–4). Male mandrels are preferred when an article with an aspect ratio of less than 2 is desired (column 4, lines 4–5).

When the aspect ratio is determined by length to diameter, the aspect ratio is less than 0.5. However, the '758 patent does not address the problems associated with preparing domes having aspect ratios greater than 0.5 as discussed above. The '758 patent also does not disclose the orientation of mandrels in a vapor deposition chamber to obtain high aspect ratio domes.

A paper by Goela et al. Entitled "Fabrication of Conformal ZnS Domes by Chemical Vapor Deposition" presented at the SPIE meeting at Orlando, Fla. on Apr. 5–9, 1999 and on May 11–13, 1999 discloses domes made of ZnS with high aspect ratios using male mandrels. Although the paper discloses the process conditions and the material composing the mandrels, the paper is silent on mandrel orientation in the deposition chamber. An earlier paper also by Goela et al.

Entitled "Precision Replication of Conformal ZnS Optics" disclosed at the 7th DOD Electromagnetic Window Symposium at APL, Laurel, Md., on May 5–7, 1998 discloses employing articles made on male mandrels. Process conditions for vapor depositing ZnS on the mandrels are disclosed, but not mandrel orientation in the deposition chamber.

FIG. 3 shows a schematic of chemical vapor deposition by impinging flow. In the impinging flow schematic, both the male and female mandrels can be used and the flow of gases is parallel to the dome axis. The parallel orientation of the domes reduces the available deposition area, i.e. fewer mandrels can be placed in the deposition chamber. Placing several mandrels in stages can increase the deposition area. However, this reduces deposition thickness considerably from one stage to the next due to reagent depletion effects. Domes with very large thickness variations are produced. Also fabrication time is increased, and material yield is reduced. Thus this method is cost ineffective. FIG. 3 shows male mandrels 42 on isolated fixtures 46 in a deposition chamber 44 in a two-stage impinging flow configuration. Gas flow 48 has to negotiate several bends to move from one stage to the other stage. Such bending depletes the reagents at a faster rate and increases the thickness non-uniformity of the domes from stage to stage. Accordingly, there is a need for a method and apparatus with an improved mandrel orientation to prepare domes with high aspect ratios.

Another problem associated with vapor deposition on a mandrel is cracking of the article when it is removed from the mandrel. Cracks or flaws can form at structural weak points in the article during chemical vapor deposition. Such flaws are common along the flange portion of domes formed at the base of the mandrel. Such flaws can lead to the cracking of the dome when it is removed from the mandrel. Loses of deposited articles can be costly to the industry. Accordingly there also is a need for a method of preventing unwanted cracking of deposited articles.

A primary object of the present invention is to provide an apparatus and method that enables the formation of high aspect ratio domes.

Another object of the present invention is to provide an apparatus and method that prepares high aspect ratio domes employing male mandrels.

A further object of the present invention is to provide a method of preparing high aspect ratio domes where the deposit is thicker at the apex than the base of the dome.

An additional object of the present invention is to provide a method of making high aspect ratio domes such that the domes do not crack when the domes are removed from the mandrels.

Other objects and advantages of the present invention will be apparent to those of skill in the art by reading the following description and the appended claims.

SUMMARY OF THE INVENTION

The present invention is directed to an apparatus and method of preparing high aspect ratio domes by chemical vapor deposition on male mandrels. The male mandrels have a configuration that is negative to the surface of the domes produced. The mandrels are placed in a deposition chamber of any suitable furnace for chemical vapor deposition such that reactant gas flow does not directly impinge on the mandrels. The orientation of the mandrels is such that the axis of each mandrel is perpendicular to the flow of gas in the vapor deposition chamber.

The mandrels can be secured to the vapor deposition chamber by any suitable means such that the gas flow does not impinge on the mandrels. One means of securing the mandrels to the chamber is by an isolation fixture. The isolation fixture also isolates the mandrels from the rest of the vapor deposition furnace. In one embodiment of the present invention, the vapor deposition chamber has arch elements that hold the mandrels at a distal position to the reactant flow pathway and convection current pathway. Advantageously the apparatus and method produces a dome such that the deposit thickness is larger at the dome apex than at the base of the dome. When gas flow is allowed to directly impinge on the mandrels, large variations in dome thickness are observed. The present invention also prevents material quality degradation on mandrels.

Additionally the apparatus and method of the present invention permits easier dome release from the mandrel reducing the chances of the dome cracking. Further, a larger number of domes can be produced using fewer gas injectors than in the impinging flow configuration. The orientation of the mandrels of the present invention eliminates the obstacles to gas flow thus reducing the amount of reactants and gas injectors required. A high aspect ratio also is produced by the apparatus and method of the present invention. High aspect ratio domes are highly desirable. High aspect ratio domes employed on missiles and aircraft substantially reduce drag. Also, when high aspect ratio domes are employed as windows on infrared sensors for navigation, targeting and guidance systems the domes permit good coverage of a desired target area. The domes fabricated by the present invention do not require further machining to their final shape, and may or may not need minimal buffing to provide the required surface smoothness or finish.

Another aspect of the present invention is an edged means to assist removal of the vapor deposited domes from the mandrels. The edged means is secured to a mandrel holder such that a portion of the edged means contacts a base portion of the mandrel during vapor deposition. Advantageously, the edged means permits formation of a seam in the base portion of the deposited material. The seam permits removal of the deposited dome from the mandrel without the dome cracking. Preferably, the edged means is in the shape of a ring that can be readily secured to the mandrel holder of the apparatus.

DETAILED DESCRIPTION OF THE INVENTION

Chemical vapor deposited solid bodies are prepared by reacting a chemical precursor material in the presence of a suitable substrate such that the precursor material reacts causing the desired material to form a deposit on the substrate. The reaction is continued for a sufficient time to form a deposit of desired thickness. Once the desired thickness is deposited the reaction is discontinued and the deposit separated from the substrate. The present invention utilizes male mandrels to form high aspect ratio domes by depositing suitable materials on the mandrels by chemical vapor deposition. The male mandrels have a negative configuration to the shape of the domes desired. The base of the mandrels has a flange that joins the base throughout its circumference. The mandrels are secured to an isolation fixture means such that when the mandrels are placed in a chemical vapor deposition chamber in a vapor deposition oven the flow of chemical reactants does not impinge on the mandrels. Preferably, the mandrels are arranged such that the axis of each mandrel is perpendicular to the flow of the reactants in the deposition chamber. In one embodiment the isolation fixture has a back support means that contacts and supports the base of the mandrel. The back support means joins the mandrel holders by a mandrel holder connecting means. The mandrel holders contact the mandrels at the flanges of the mandrels to secure the mandrels to the back support means. The mandrel holders are joined to a vapor deposition chamber securing means for securing the mandrel holders and back support means to the vapor deposition chamber. The means connecting the isolation fixture to the deposition chamber may be an integral part of the deposition chamber or a separate structure that can be connected to the chamber. The isolation fixtures are placed in the deposition chamber such that the axis of each mandrel is at least 1 mm from the flow of reactants. Preferably, the axis of the mandrel is from about 1 mm to about 20 mm from the flow of reactants. The deposition chamber may be secured in the furnace by any suitable means. The chamber may be bolted in the furnace or the chamber may be freely placed in the furnace.

In addition to securing the mandrels to a position such that the flow of reactants does not impinge on the mandrels, the isolation fixtures ensure adequate isolation of the deposited material on the mandrels from the deposition chamber. During deposition much of the interior of the deposition chamber and furnace is covered by deposit material. Cracks formed in the deposit material on parts of the furnace and deposition chamber can continue onto the deposit material on the mandrels. The isolation fixtures isolate the deposit material on the mandrels from cracks formed in the deposit material on the chamber and furnace. Thus the isolation fixtures improve dome yield.

Figure 4:
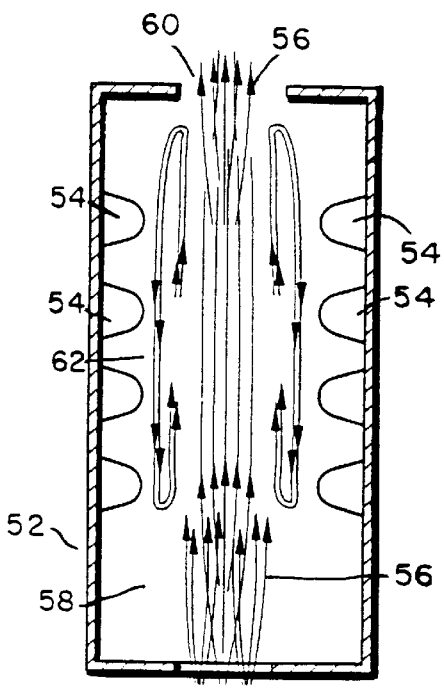
FIG. 4 shows a schematic of multiple male mandrels mounted on the walls of a deposition chamber such that the gas flow does not directly impinge on the mandrels.

FIG. 4 shows a schematic of an apparatus within the scope of the present invention. FIG. 4 shows multiple male mandrels 54 secured along two sides of deposition chamber 52. Chemical reactants 56 in gas form flow from a source (not shown) through deposition chamber interior 58 to exhaust port 60 without impinging on mandrels 54. Convection currents 62 containing reactants also pass over the mandrels without impinging on them. The chemical reactants in the vapor deposition chamber diffuse onto the surface of the mandrels to form domes thicker toward the apex of the domes than at their base.

Figure 5:
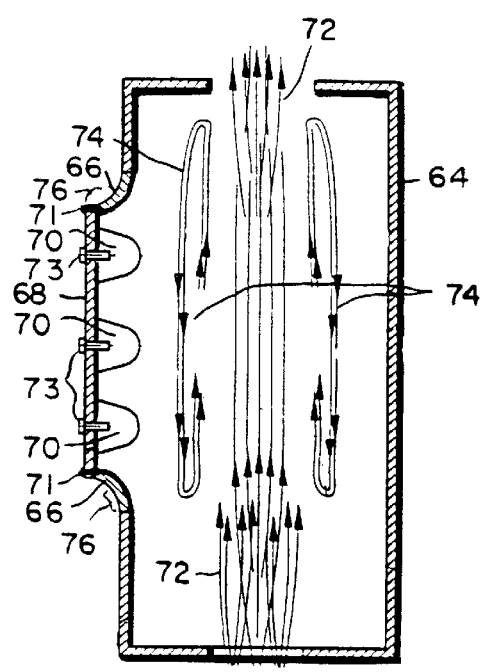
FIG. 5 shows a schematic of multiple male mandrels mounted on the walls of a deposition chamber with arch extension elements to prevent the flow of gas from impinging on the mandrels.

FIG. 5 shows an alternative embodiment of the present invention. The deposition chamber 64 has arch elements 66 connected to isolation fixture 68 to keep the mandrels 70 out of the pathway of the flow of the reactants 72 as well as out of the convection pathway 74. The mandrels 70 are secured to isolation fixture 68 by bolts 73. The arch elements can be connected to the deposition chamber in any suitable way. The arch elements may be one piece with the chamber. The arch elements 66 in FIG. 5 are joined to deposition chamber 64 by bolts 71. The arch elements have arc angles 76 to keep the mandrels away from the flow of reactants and convection currents in the deposition chamber. The arc angles 76 can range from about 300 to about 100°, preferably from about 45° to about 90°.

Figure 6:
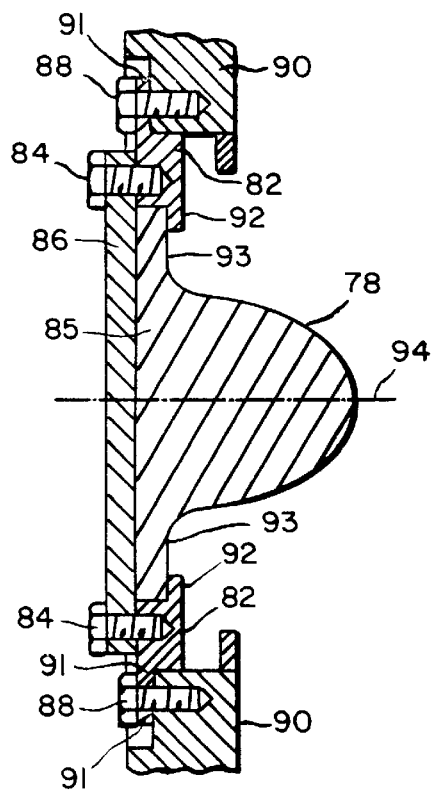
FIG. 6 shows a side view illustration of a male mandrel in an isolation fixture.
Figure 7:
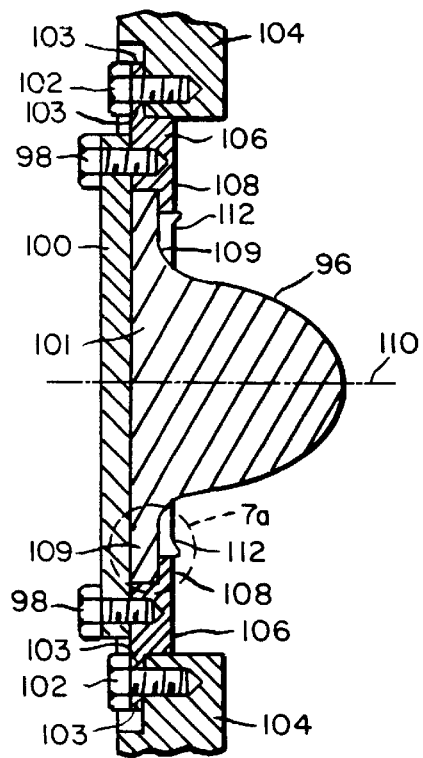
FIG. 7 shows a side view illustration of a male mandrel in an isolation fixture and placement of an edged ring to assist in removing a vapor deposited dome from the mandrel.

FIGS. 6 and 7 show a male mandrel secured to an isolation fixture more elaborate than shown in FIG. 5. The mandrel holders 82 and 106 contain bolts 84 and 98 to secure the mandrel holder back plates 86 and 100 to the mandrel holders 82 and 106. The mandrel holder back plates 86 and 100 support the bases 85 and 101 of the mandrels in the isolation fixtures. Bolts 88 and 102 secure the mandrel holders 82 and 106 to plates 90 and 104. Bolts 88 and 102 pass through mandrel holder flanges 91 and 103, respectively. Plates 90 and 104 are contiguous with their respective sides of their deposition chambers (not shown). Plates 90 and 104 secure the isolation fixtures and the mandrels to the deposition chambers. Flanges 92 and 108 of mandrel holders 82 and 106 contact flanges 93 and 109 of mandrels 78 and 96 to further secure the mandrels to the isolation fixtures. The axis 94 of mandrel 78 and axis 110 of mandrel 96 are arranged perpendicular to the flow of reactants in their respective deposition chambers. FIG. 7 shows an additional structure that is not included in the isolation fixture of FIG. 6. FIG. 7 shows edged ring 112 secured to the mandrel holder flange 108 and in contact with flange 109. The edged ring facilitates removal of the deposited dome from the mandrel. Details of the structure and function of the edged ring are discussed below. The means of securing a mandrel to a deposition chamber is not limited to the apparatuses shown in FIGS. 5, 6 and 7. A mandrel can be placed into a chemical vapor deposition chamber of a furnace by any suitable means as long as the gas reactants do not impinge on the mandrel.

A vacuum deposition chamber furnace of the present invention contains a vacuum housing. The housing may be composed of a plurality of sides or the housing may be cylindrical. A retort with a first heating means is placed at the base of the furnace. The retort holds molten reactants. The base of the furnace also has a gas source for generating both gas reactants and an inert gas carrier into a deposition chamber. The top of the housing has a cover with an exhaust port. The deposition chamber is placed in the furnace such that a deposition chamber entrance port is in fluid contact with the retort and gas source. Opposite the entrance port is a deposition chamber exhaust port in contact with the exhaust port of the furnace. Non-reacted materials pass out of the chamber through the exhaust port.

Figure 1:
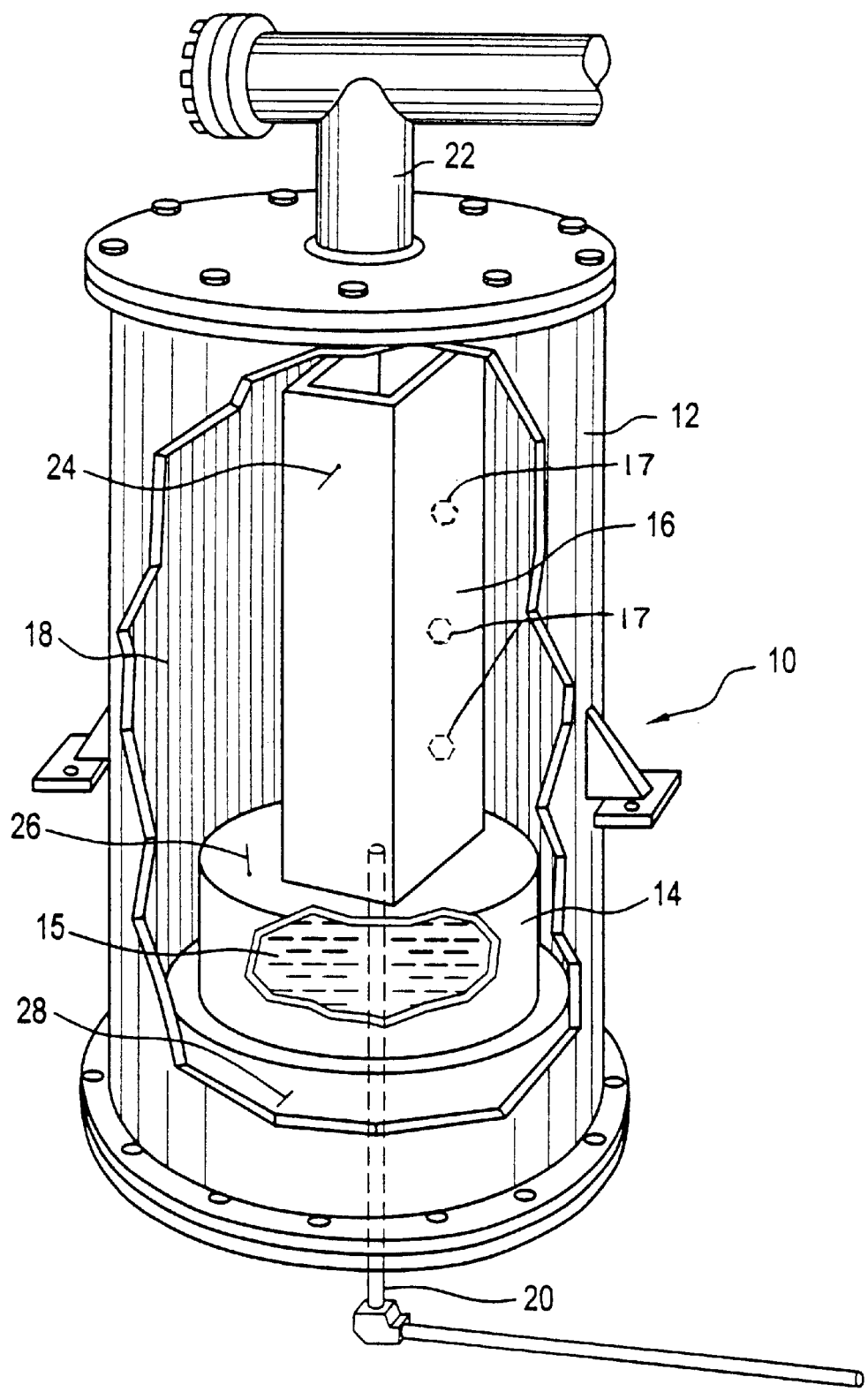
FIG. 1 is a schematic view, partially in section, of a furnace for chemical vapor deposition.
Figure 2:
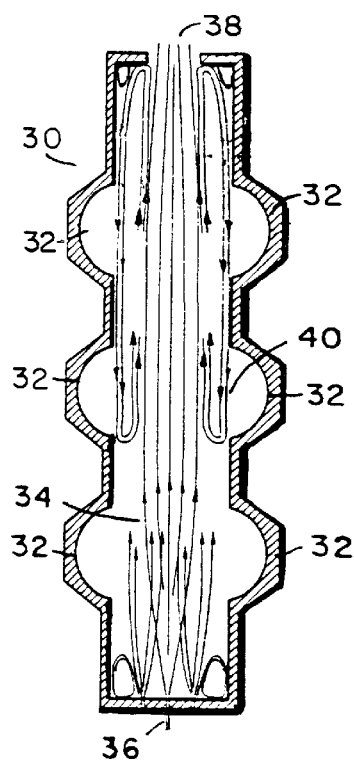
FIG. 2 shows a schematic of multiple female mandrels in an isolation fixture.
Figure 3:
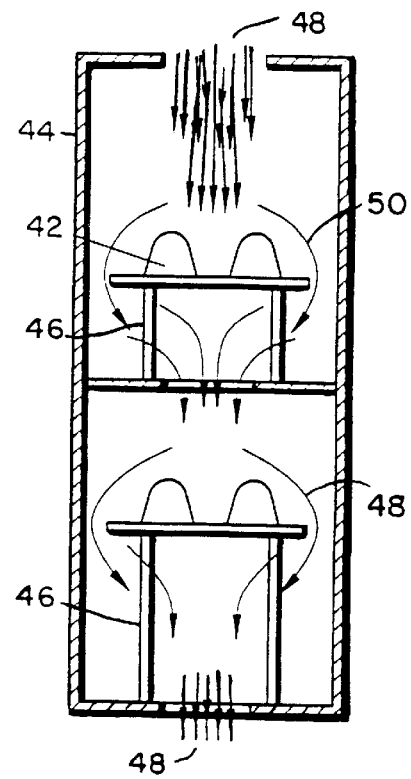
FIG. 3 shows a schematic of a two-stage impinging flow configuration used to produce domes on male mandrels.

A furnace for producing domes within the scope of the present invention is illustrated in FIG. 1. The furnace 10 is enclosed in a vertically orientated water-cooled stainless steel vacuum chamber housing 12. A graphite retort 14 containing molten reactants, such as zinc, 15 and provided with a first heating means, such as resistance and/or radiant heating elements, is provided near the bottom of the chamber 12. A rectangular isolation fixture 16 is arranged above the retort 14 with its interior in flow communication with the retort. The isolation fixture 16 contains multiple male mandrels with the axis of each mandrel perpendicular and out of the pathway of the reactants (not shown). Each mandrel is bolted by bolt 17 to the isolation fixture 16. The isolation fixture 16 in the embodiment of FIG. 1 also acts as a deposition chamber. Second heating means 18 capable of heating the mandrels are provided around its exterior. A gas injector 20 provides gas reactants, such as hydrogen sulfide, and an inert carrier gas to the lower portion of the deposition chamber's interior. The gas exhaust 22 at the top of the housing 12 is operatively connected to a filtration system (not shown) to remove particulates, then to a vacuum source, such as a vacuum pump (not shown) and finally to a scrubber (not shown) to remove unreacted hydrogen sulfide and any other toxic products. The temperature of the deposition chamber is measured by a thermocouple 24 touching the chamber at its external surface. The temperature of the molten material in the retort is measured by two thermocouples, one 26 touching the upper portion of the retort's wall (above/near the level of molten material) and another thermocouple 28 extending to the lower portion of the retort's wall (below the level of molten material).

In operation the deposition chamber is brought to an elevated temperature and the pressure in the furnace is reduced. Molten materials vaporized in the retort 14 at a first temperature are mixed with the injected gas reactants and carrier gas as they enter the isolation fixture 16. The mixed gases flow through the interior of the deposition chamber where they contact the heated interior surface of the chamber and mandrels. The chamber and mandrels are heated to a second temperature, or substrate temperature, causing the reactants to react and deposit on the mandrel surfaces. The carrier gas and any gaseous or entrained reaction products are removed from the chamber at the gas exhaust 22 and processed through the filtration and scrubbing systems. Once started the process is continued until the desired thickness of product is deposited on the mandrels. The process takes more than 15 hours and can take up to 1100 hours, and more often takes between 100 and 600 hours. When the desired thickness is achieved the gas flow through the gas injector 20 is discontinued. The first heating means is turned down, and the second heating means 18 is turned off. The pressure within the furnace is returned to ambient, the chamber housing 12 is opened and the mandrels are removed. The deposited domes on the mandrels are removed therefrom and, if necessary, are machined polished on the inside surfaces to produce domes of desired dimensions. Preferably, the inside surfaces are reduced to a roughness of about 10 to about 200 angstroms.

The fabrication of the substrate, or mandrel, is critical to the process of the present invention. The mandrel preferably is made of a material that will withstand the high temperature and corrosive environment of the CVD process. The mandrel material preferably is inert to the deposited material, has an appropriate coefficient of thermal expansion (CTE), is durable and can be produced in the required sizes, shapes and degrees of finish or interest. When the mandrel material has the same CTE as the deposit, CTE corrections in the mandrel shape are not necessary. Separation of the mandrel from the replica is assisted by providing a male mandrel with a CTE slightly larger than that of the deposit material. The mandrel will shrink away from the deposit.

Mandrel material for most applications is the same material as the deposit being replicated. Such deposits on a mandrel of identical material are difficult or impossible to separate from the mandrel. A release coating is applied to the mandrel that enables the deposit to be readily removed from the mandrel. The release coating preferably (a) withstands the high temperature and corrosive environment of the CVD process, (b) possess minimal stresses capable of altering the figure and finish of the mandrel, (c) completely covers the mandrel surface to be replicated and be free of pinholes, (d) be capable of substantially retaining the figure and finish of the underlying mandrel surface, and (e) bond more strongly to the mandrel than to the replicated article. The best combination of theses properties are found in coating materials formed of at least one element chosen from a different group of the Periodic Table than the mandrel/deposit material. For instance, if the mandrel and replicated article are fabricated of zinc sulfide, a compound of elements from the second and sixth groups of the Periodic Table, the preferred combination of coating properties, especially the release property will be found in materials having at least one element selected from the Periodic Table groups other than the second and sixth. Metals and oxides are believed to be particularly suitable for use as the release coating material.

The release coating is applied as a thin coating covering the surface to be replicated. The coating may be up to about 20 microns thick, preferably about 1500 to about 3500 angstroms thick. Care is to be exercised to avoid pinholes extending through the coating. Applying the coating as two layers reduces the potential of pinholes extending through the coating. The functionality of some coatings, especially metallic coatings, can be improved by annealing the coated mandrel.

Suitable materials for mandrels to practice the present invention include, but are not limited to, alumina coated zinc sulfide, tantalum, titanium, platinum, aliminum oxide (both alumina and sapphire), zinc selenide, graphite and the like. Preferred mandrel materials are alloys of alumina and ZnS, tantalum and titanium and alumina and titanium. Tantalum is also a release coating material for use with zinc sulfide deposits. The various mandrel and coating materials for use with zinc sulfide also are functional for precision replication of zinc selenide and silicon carbide deposits. The mandrels used in the inventive process can be polished to a high degree of finish and can be reused to produce precision replicas, thereby significantly reducing the machining necessary to provide articles of the required figure and finish. While graphite is a suitable substrate material for the production of near-net shape articles, it is relatively porous and cannot be polished to a high degree of figure and finish. This property, along with its tendency to leave contaminants on the replica's surface, limit graphite to applications for producing near-net shape or coarser articles. Surface smoothness for a mandrel can range from about 4 to about 100 angstroms RMS depending on the material employed. For example, surface smoothness on tantalum mandrels ranges from about 5–6 angstroms RMS, ZnS from about 24–41 angstroms RMS and titanium about 33–90 angstroms RMS.

Another aspect of the present invention is an edged means for assisting removal of the deposited dome from the mandrel. The edged means is placed on a flange of the mandrel prior to vapor deposition. As the material is being deposited on the mandrel the edged means in contact with the flange of the mandrel is coated with the material. A seam is formed in the deposited material along the edge of the edged means. The seam initiates a line of fracture along the flange of the dome such that the dome can be readily removed from the mandrel without breaking. The edged means can be any suitable shape as long as it creates a seam in the flange of the dome. Preferably, the edged means is a ring with a base for resting on the flange of the mandrel. The base is contiguous with a side terminating with a top having a knife-like edge.

Figure 7A:
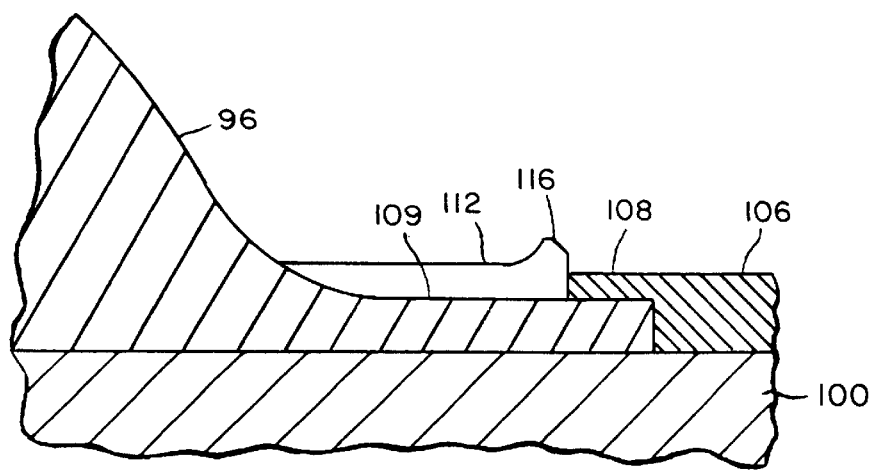
FIG. 7a shows an enlarged illustration of the edged ring secured to the mandrel holder and resting on the flange of the mandrel.
Figure 8:
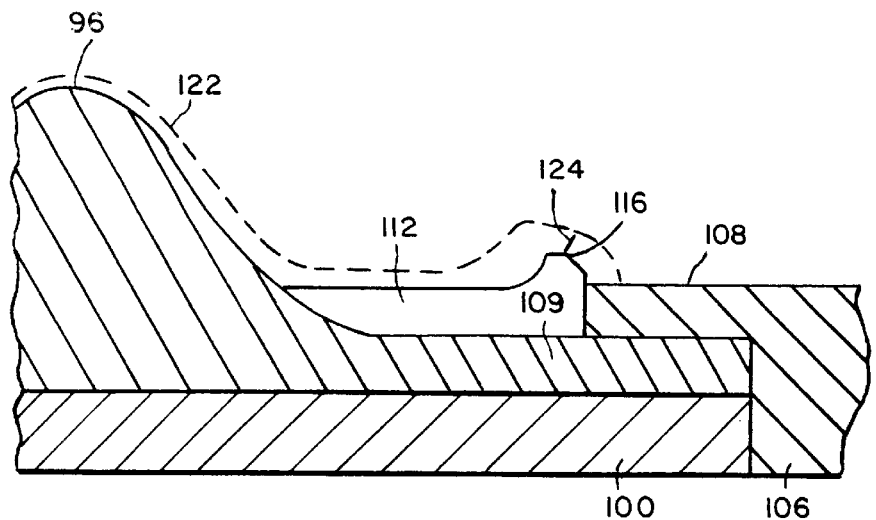
FIG. 8 shows a close up view of an edged ring and the seam formed by the ring after vapor deposition of material on the mandrel.

FIG. 7 shows a mandrel on an isolation fixture similar to that in FIG. 6 except for the addition of an edged means. The edged means is in the shape of a ring 112 placed on the flange 109 of the mandrel 96 and secured laterally by contacting mandrel holder flanges 108. FIG. 7a shows an enlarged illustration of the edged ring 112 secured to the flange 109 of the mandrel 96. The knife-like edge 116 of the ring faces up and opposite to the flange 109. As shown in FIG. 8 when deposit material 122 coats the surface of the mandrel 96 a seam 124 is formed at the knife-like edge 116 in the deposit material. Advantageously, the seam 124 formed in the deposit 122 by the edge 116 prevents the dome from cracking when the dome is removed from the mandrel 96.

Figure 9:
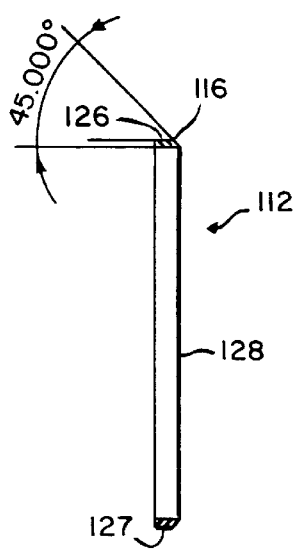
FIG. 9 shows a cross section of an edged ring used to assist removal of a deposited dome from a mandrel.

FIG. 9 shows a cross section of the ring 112 with a knife-edge 116 and having a wall 128, top 126 and base 127. The knife-edge 116 circumvalates the entire top 126 of ring 112. The size and dimensions of the edged means can vary depending on the size of the mandrel and the mandrel holder employed. Ring diameters can range from about 50 to about 100 cm. Ring thickness can range from about 0.1 to about 5 mm. The angle of the knife-edge with respect to the ring surface can be from about 30 to about 90°. The edged means may be made of any suitable material that is compatible with the conditions of chemical vapor deposition. Examples of such materials are tantalum, titanium, platinum, aluminum, stainless steel and the like. Preferably, the edged means is composed of tantalum or titanium.

The method of the present invention produces domes of aspect ratios of about 0.1 or greater. Preferably, the aspect ratio is greater than 0.5. The aspect ratio (AR) is defined as the ratio of the dome length to its diameter. As discussed above, the flow of the gaseous reagents in the deposition chamber flows perpendicular to the axis of the male mandrels and the domes forming on the mandrels. To obtain domes within the scope of the present invention, the flow of gaseous reactants can not impinge on the mandrels. The gaseous reactants diffuse onto the surfaces of the mandrels such that the thickness of the domes is greater towards the apex than at the base. Dome thickness ranges from about 0.75 cm to about 2.5 cm thick at the dome apex. The base of the domes at the thinest point ranges from about 0.5 cm to about 1.25 cm. Such a dome structure is less likely to break when removed from a mandrel. Thus a more durable dome is produced, and dome production is increased. Preferred CVD materials such as ZnS, ZnSe and SiC are deposited on male mandrels upon which a release coating is applied. Other suitable deposition materials include, but are not limited to, aluminum nitride, boron nitride, diamond and silicon.

The reaction conditions of the process of the present invention employ furnace temperatures of from about 500 to about 1500° C. The temperature range of the retort containing molten metal is from about 500 to about 1000° C. Pressures in the furnace range from about 10 to about 80 torr. Flow rates for gas reactants range from about 5 slpm to about 80 slpm. Specific conditions vary within the above ranges depending on the reactants employed. Reactants employed to practice the present invention are in gaseous form, and conditions in the furnace and deposition chamber are such as to generate gases. Further, the gaseous reactants react together and are transported through the deposition chamber in an inert gas medium. Any suitable inert gas can be employed to practice the present invention. Suitable gases include, but are not limited to, argon, helium, krypton, xenon and the like. For example, Specific conditions for preparing ZnS domes are a furnace temperature range of from about 670 to about 740° C. The pressure in the furnace can range from about 10 to about 60 torr, and the retort temperature to generate Zn vapors is from about 600 to about 650° C. The sulfur source preferably is hydrogen sulfide gas, and the inert gas employed preferably is argon. After deposition is complete the deposits are released from the mandrels to yield freestanding domes. The domes may be machine-polished on their inside surfaces to produce finished domes of desired dimensions.

EXAMPLE 1

Near-net shape ZnS domes with aspect ratios of about 0.8 had been produced using an apparatus and method of the present invention. The ZnS was deposited on mandrels using a CVD process described below.

The vacuum furnace employed to produce the high aspect ratio ZnS domes is shown in FIG. 1. The vacuum furnace consisted of a water-cooled cylindrical stainless steel chamber that was heated resistively using graphite-heating elements. At the bottom of the furnace was placed a graphite retort that contained zinc. The retort was heated to a temperature of about 600–650C to generate zinc vapor with a pressure of about 10 torr. The zinc vapor was carried to the deposition area using argon as a carrier gas. Hydrogen sulfide was introduced into the deposition area through a central injector. Zinc sulfide was deposited by diffusion on six male mandrels. The mandrels were orientated such that their apices were perpendicular to the flow of reactants. The flow of reactants did not impinge on the mandrels. Three of the mandrels were made of titanium and three were made of graphite. The mandrels for the formation of high aspect ratio domes were mounted on the inside walls of the chamber as shown in FIGS. 6 and 7. All three of the graphite mandrels were mounted as in FIG. 6 without a titanium ring. One of the titanium mandrels was mounted with the titanium ring as shown in FIG. 7, while the other two were mounted as in FIG. 6. A rectangular deposition chamber was employed because such chambers maximize the deposition area in vacuum furnaces. The mandrels were mounted on the narrow side of the rectangular chamber because the diameter of the domed products was to be less than the width of the narrow side of the chamber. Otherwise the mandrels would have been mounted on the wider side of the chamber.

The furnace temperature during the deposition process was about 690° C. The hydrogen sulfide/Zn molar ratio was about 0.775. The hydrogen sulfide flow rate was about 9.3 slpm. The argon flow rate was about 60 slpm for 25% of the run time ramping it down to about 20 slpm for the next 25% of the time and then maintaining it constant for the remainder of the run. The ZnS deposition was terminated after about 189 hours.

After vapor deposition was terminated the domes were inspected for quality. The three domes deposited on the titanium mandrels were removed from their respective mandrels without any cracks. The dome vapor deposited on the mandrel with the titanium ring was separated from the fixture without difficulty. In contrast the domes vapor deposited on the fixtures without the ring were difficult to remove. Accordingly, the employment of the ring structure on the fixture was an improvement.

Figure 10:
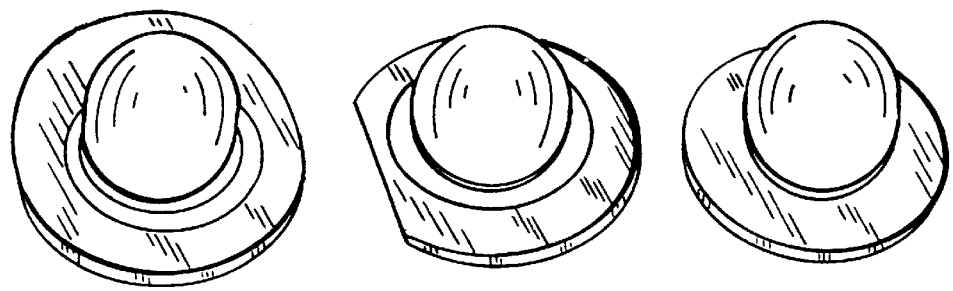
FIG. 10 shows a photograph of three ZnS domes produced according to the method of the present invention.

FIG. 10 is a black and white copy of a photograph showing the domes produced on the three titanium mandrels. Visible is the as-deposited ZnS surface. The inside surface of these domes is near-net shape. The domes were machined polished on the inside surfaces to produce the finished domes of the desired dimensions. The three domes on the graphite mandrels cracked. The cracking was caused by stresses associated with thermal expansion mismatch between the graphite and ZnS.

EXAMPLE 2

The chemical vapor deposition method of the present invention was used to prepare ZnS domes from about 5.4 cm diameter by about 4.4 cm long to about 17.30 cm diameter by about 14.06 cm long.

Figure 11:
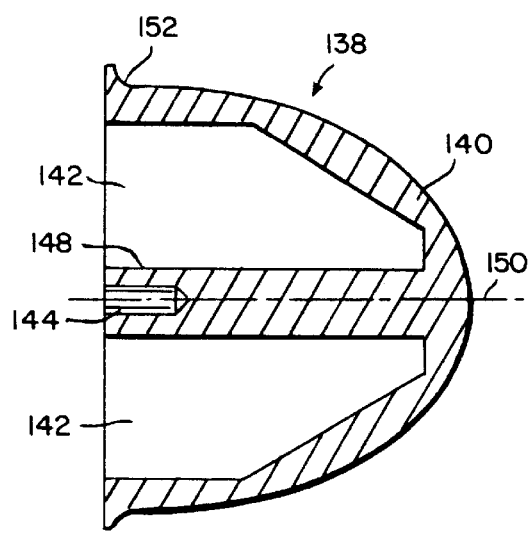
FIG. 11 shows the titanium mandrel employed in preparing high aspect ratio domes by the method of the present invention.

Titanium mandrels were employed to prepare ZnS domes. FIG. 11 shows a schematic of a titanium mandrel 138 employed. Because the inside surface of the domes was produced in the near-net surface, the outer surface of the mandrels 140 was made close to but slightly smaller than the dome inside surface. Such a structure allows for machining and polishing the surfaces of the domes. The inside dimensions of the domes were about 16.26 cm in diameter by about 13.92 cm long. The titanium mandrels had a hollow space 142 to reduce its weight. A threaded hole 144 was provided in the center of a support column 148 for mounting on a graphite isolation fixture in the deposition area. The support column 148 was congruous with the mandrel apex 150. A small flange 152 was provided at the base of the mandrel to allow smooth transition of the dome profile from a curve to a flat shape.

FIG. 5 shows a schematic of the CVD deposition area that produced the large ZnS domes. The deposition chamber 64 was extended on one side using the arch extension elements 66. A graphite isolation fixture 68 was attached to the arch extension elements 66 using bolts 71. Each mandrel 70 was mounted on the graphite isolation fixture 68 using bolts 73. The edged shaped ring employed in Example 1 above was not used. The arch extension elements 66 maintain the mandrels out of the direct flow of the deposition gases 72 as well as the flow of the convection currents 74. Such an apparatus prevented the flow of gases from impinging on the surface of the mandrels. The deposition materials deposited on the mandrels by diffusion to form ZnS domes. The domes were thicker towards their apices than their bases.

Figure 12:
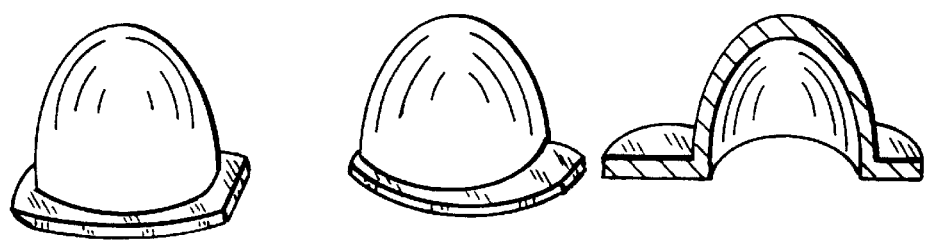
FIG. 12 shows a photograph of three ZnS domes prepared on a titanium mandrel with one dome split showing the thickness profile of the dome.

The process conditions were the same as described in Example 1 above except that the ZnS deposition was performed for 190 hours. One dome cracked because a titanium ring was not employed to assist in the removal of the dome from the mandrel. The other domes that were prepared had titanium rings around their bases. FIG. 12 is a photograph of three domes that were produced including the dome that cracked upon removal from the mandrel.

The two domes that came out in one piece were machined and polished to produce domes of required dimensions. The ZnS domes had an aspect ratio of about 0.8 and a dome diameter of about 17.30 cm×about 14.06 cm. Although the third dome split down the middle, the dome illustrates the thicker upper dome region in contrast to the base thickness produced by the method of the present invention.

The above Examples are intended to further illustrate the present invention and are not intended to limit the scope of the present invention.

What is claimed is:

1. A method for preparing high aspect ratio domes comprising:

(a) providing at least one male mandrel in a chemical vapor deposition chamber such that the at least one male mandrel is oriented in the deposition chamber at a distal position to reactant flow pathways and convection current pathways such that a flow of reactants and convection currents in the deposition chamber do not impinge on the mandrel, (b) generating the reactants as gases from a source of reactants, (c) passing the gas reactants through the deposition chamber and past the mandrel such that the flow of gas reactants does not impinge on the mandrel; and (d) depositing the gas reactants on the at least one mandrel by diffusion to form at least one dome with an aspect ratio of greater than 0.1.

2. The method of claim 1, wherein the at least one male mandrel is orientated in the deposition chamber such that an axis of the mandrel is perpendicular to the flow of gas reactants.

3. The method of claim 1, wherein the at least one dome comprises ZnS, ZnSe, or SiC.

4. The method of claim 1, wherein the mandrel is composed of titanium, tantalum, platinum, aluminum oxide, ZnSe, alumina/ZnS, tantalum/titanium or alumina/titanium.

5. The method of claim 1, further comprising the step of coating the mandrel with a material to assist removal of the dome from the mandrel.

6. The method of claim 5, wherein the coating is from about 1500 to about 3500 angstroms thick.

7. The method of claim 5, wherein the coating comprises metal oxides of titanium, tantalum, platinum or silicon.

8. The method of claim 1, wherein the reactants are at a temperature of from about 500 to about 1500° C.

9. The method of claim 1, wherein the deposition chamber is at a pressure of from about 10 to about 80 torr.

10. The method of claim 1, further comprising the step of removing the deposited dome from the mandrel followed by polishing an interior of the dome to reduce surface roughness to about 10 to about 200 angstroms.

11. The method of claim 1, wherein the aspect ratio is greater than 0.5.

12. The method of claim 1, wherein the at least one dome has a thickness at an apex of from about 0.75 cm to about 2.5 cm, and a base of the at least one dome at a thinnest point ranges from about 0.5 cm to about 1.25 cm.

* * * * *